(12) United States Patent
Barber

(10) Patent No.: US 6,818,365 B2
(45) Date of Patent: Nov. 16, 2004

(54) FEED FORWARD LEVELING

(75) Inventor: Duane B. Barber, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 209 days.

(21) Appl. No.: 10/295,489

(22) Filed: Nov. 15, 2002

(65) Prior Publication Data

US 2004/0096759 A1 May 20, 2004

(51) Int. Cl.$^7$ .............................. G03F 9/00; G03C 5/00
(52) U.S. Cl. ........................................... 430/30; 430/22
(58) Field of Search ..................... 430/22, 30; 356/399, 356/400, 401

(56) References Cited

PUBLICATIONS

ASML 8 Spot Functionality for LSI Gresham, Presentation given to LSI Engineers by ASML.

*Primary Examiner*—Christopher G. Young

(74) *Attorney, Agent, or Firm*—Luedeka, Neely & Graham, P.C.

(57) ABSTRACT

A method for leveling an exposure field of view at a peripheral edge of a substrate. The field of view is aligned to a first position at the peripheral edge of the substrate, where the field of view has an inner edge and an outer edge, relative to the peripheral edge of the substrate. Whole device patterns within the field of view are identified, and the alignment of the field of view is altered to a second position so as to place the outer edge of the field of view adjacent the whole device patterns within the field of view. Level measurement information from the field of view at the second position is acquired and stored. The field of view is realigned to the first position, and the substrate is leveled within the field of view at the first position using the level measurement information acquired from the field of view at the second position.

20 Claims, 1 Drawing Sheet

FEED FORWARD LEVELING

FIELD

This invention relates to the field of integrated circuit fabrication. More particularly, this invention relates to projection alignment and leveling of integrated circuits in substrate form during photolithographic processing.

BACKGROUND

Integrated circuits are basically formed of a plurality of layers, where different features are formed in each of the various layers. The features in each of the various layers are typically formed using a photolithographic process. As a part of the process, a photolithographic mask is prepared with the desired image formed in the mask. The substrate on which the integrated circuit is to be formed is coated with a photosensitive material called photoresist, and the photoresist is exposed with a light that is passed through the mask. Thus, the image present in the mask is projected onto the photoresist coated substrate, thereby exposing portions of the photoresist to the light, and masking other portions of the photoresist from the light.

Depending on the type of photoresist used, either negative or positive, those portions of the photoresist that are exposed to the light either remain after the photoresist is developed, or are washed away during the developing process. After a hard bake to drive out solvents from the remaining photoresist, the patterned layer on the substrate is processed in some manner, such as being etched, and the photoresist is removed. A new layer is then deposited or otherwise formed, and the process repeats itself until wafer form processing of the integrated circuit is substantially completed.

There has been a tremendous effort throughout the history of integrated circuit technology to continually find ways to reduce the size of the devices and structures within the monolithic integrated circuits so fabricated. Many problems inherent with the shrinking geometries of integrated circuits have been identified and overcome over the years of such development.

For example, one problem has to do with the imaging process described above. As device size has become increasingly smaller, the precision with which the pattern is focused on the substrate becomes increasingly important. For example, a very large image can tolerate a relatively softer focus better than a very small image can, because the softer focus has a smaller overall effect on the size of the very large image. Thus, factors that didn't create an issue with focus in the past, tend to now create problematic issues with focus.

As a specific example, as the layers of the integrated circuit are built up through front end processing, the surface of the substrate tends to become somewhat uneven, and more especially so at the edges of the substrate. This degree of surface topography tends to be sufficient to require adjustments in the leveling of the substrate during exposure, as the reticle is stepped across the surface of the substrate. By adjusting the level of the substrate with each reticle step, the surface of the substrate within that field of view can be properly imaged.

Leveling is typically accomplished with laser beam measurement systems that are disposed in positions such as at the corners of the exposure field, and which detect the height of the substrate at each such position. However, for those fields of view that are at the edge of the substrate, one or more of the measurement positions may be off the edge of the substrate, rendering a measurement at that position impossible. Additionally, because the topography of the substrate tends to be extremely variable near the outer edge of the substrate, a measurement taken very near the edge of the substrate may not be representative of the height of the substrate adjacent the measurement position.

What is needed, therefore, is system by which devices within image fields at the edge of the substrate can be properly leveled.

SUMMARY

The above and other needs are met by a method for leveling an exposure field of view at a peripheral edge of a substrate. The field of view is aligned to a first position at the peripheral edge of the substrate, where the field of view has an inner edge and an outer edge, relative to the peripheral edge of the substrate. Whole device patterns within the field of view are identified, and the alignment of the field of view is altered to a second position so as to place the outer edge of the field of view adjacent the whole device patterns within the first field of view. Level measurement information from the field of view at the second position is acquired and stored. The field of view is realigned to the first position, and the substrate is leveled within the field of view at the first position using the level measurement information acquired from the field of view at the second position.

In this manner, whole device patterns disposed in a field of view at a first position near the peripheral edge of the substrate can be accurately leveled, by using leveling information that is acquired from a virtual second position that might overlap an adjacent exposure position on the substrate. The leveling information is acquired at the virtual second position, which does not hang off the edge of the substrate, and then this accurate leveling information is used to expose the field of view at the first position, thus enabling the accurate leveling of the whole device patterns within the field of view at the first position.

In various preferred embodiments, the level measurement information acquired from the field of view at the second position is obtained from at least one sensor disposed in the outer edge of the field of view, or more preferably from at least one sensor disposed in each of the outer edge of the field of view and the inner edge of the field of view. The step of acquiring level measurement information from the field of view at the second position preferably comprises setting an exposure energy at the second position to zero and initiating an exposure sequence. Preferably, the step of leveling the substrate within the field of view at the first position using the level measurement information acquired from the field of view at the second position comprises disabling active leveling at the first position and initiating an exposure sequence. The step of altering the alignment of the field of view to a second position preferably comprises shifting the field of view either vertically or horizontally.

Also described herein is a programmable substrate exposure tool having a memory containing program steps operable to instruct the programmable substrate exposure tool to perform the method as described above. Additionally described is a digital storage medium containing program steps operable to instruct a programmable substrate exposure tool to perform the method as described above.

According to another aspect of the invention there is described a method for exposing a substrate having a peripheral edge. Second positions on the substrate are exposed at a zero energy by aligning a field of view to a first position at the peripheral edge of the substrate, where the field of view has an inner edge and an outer edge, relative to the peripheral edge of the substrate. Whole device patterns within the field of view are identified. The alignment of the field of view is altered to a nearest of the second positions, so as to place the outer edge of the field of view adjacent the whole device patterns within the field of view. Level measurement information is acquired from the field of view at the nearest second position, and stored. The field of view is exposed (at zero energy) at the nearest second position.

Each first position on the substrate is exposed by realigning the field of view to the first position, and leveling the substrate within the field of view at the first position using the level measurement information acquired from the field of view at the nearest second position, and exposing the field of view at the first position. Third positions located interior to the first positions and second positions on the substrate are then exposed.

According to yet another aspect of the invention there is described a method for exposing an exposure field of view at a peripheral edge of a substrate. The field of view is aligned to a first position at the peripheral edge of the substrate, where the field of view has an inner edge and an outer edge, relative to the peripheral edge of the substrate. Whole device patterns are identified within the field of view, and the alignment of the field of view is altered to a second position so as to place the outer edge of the field of view adjacent the whole device patterns within the field of view. Level measurement information is acquired from the field of view at the second position, and stored. The field of view is realigned to the first position, and the substrate is leveled within the field of view at the first position using the level measurement information acquired from the field of view at the second position. The field of view is exposed at the first position.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
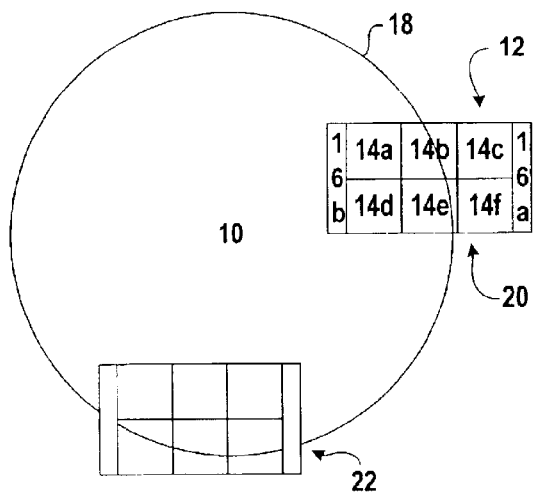
FIG. 1 depicts a substrate overlaid with a field of view in a first position, showing whole device patterns, partial device patterns, and fall off device patterns at the peripheral edge of the substrate.

With reference now to FIG. 1, there is depicted a substrate 10 overlaid with a field of view 12 in a first position 20, showing whole device patterns 14a and 14d, partial device patterns 14b and 14e, and fall off device patterns 14c and 14f at the peripheral edge 18 of the substrate 10. The field of view 12 includes sensor areas 16b and 16a, disposed respectively at an inner portion and an outer portion of the field of view 12 with respect to the substrate 10. It is appreciated that the device patterns 14 are depicted relatively larger in regard to the substrate 10 than they typically would be in actual implementation. It is appreciated that such relative sizes as depicted in the figures are not limitations, but rather are so depicted so as to enable easy understanding of the embodiments of the invention.

As depicted in FIG. 1, the whole device patterns 14a and 14d have space on the substrate to completely print, and thus that space represents integrated circuits that could be functional, and for which there is a desire to provide proper processing, such as device imaging. The partial device patterns 14b and 14e and fall off device patterns 14c and 14f cannot be made into functioning integrated circuits, because they either are not complete on the substrate 10, or are not on the substrate 10 at all.

To ensure proper leveling of the substrate 10 with respect to the whole device patterns 14a and 14d, sensors are preferably used to determine the level of the substrate 10 in the area near the whole device patterns 14a and 14d, and then proper adjustments are made within the aligner on which the processing is being accomplished, based at least in part on the level measurements that are taken. Some aligners have the ability to take a great number of level measurements in a great number of positions, but some aligners, such as described in the specific example given below, only have the ability to take a relatively few level measurements in only a relatively few positions.

For example, as depicted in FIG. 1, the aligner represented can only take level measurements in the sensor areas 16b and 16a. However, the sensor area 16a is off the peripheral edge 18 of the substrate 10. Thus, readings taken within sensor area 16a are completely invalid in regard to determining the level of the substrate 10. In one embodiment the readings taken within the sensor area 16a are ignored and just the readings within the sensor area 16b are used to determine the level of the substrate 10. However, there may be equipment that is unable to ignore the readings from within sensor area 16a and use just a single set of readings, or it may be desirable to have the increased accuracy of readings from more than just a single sensor area.

Figure 2:
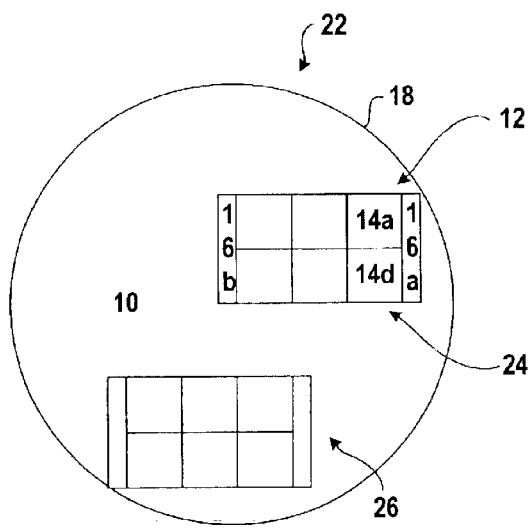
FIG. 2 depicts a substrate overlaid with a field of view in a second position, where the outer edge of the field of view is placed adjacent the whole device patterns.

Thus, according to a preferred embodiment of a method according to the present invention, the field of view 12 is moved toward the center of the substrate 10, which in the case of the first position 20 means a horizontal shift, and in the case of the alternate example depicted in the alternate first position 22 means a vertical shift. The field of view 12 is preferably moved until the outer sensor area 16a is adjacent the whole device patterns 14a and 14d, as depicted in FIG. 2, and represented by the second position 24 and the alternate second position 26.

In regard to the alternate first position 22 and the alternate second position 26, the field of view is shifted vertically until the outermost row of device patterns overlie the previously designated whole device patterns. This is another way of expressing what also happens when a horizontal move is made, except that the outermost column of device patterns is moved horizontally to overlie the previously designated whole device patterns.

With the field of view 12 shifted in this manner, level measurements can be taken from both the inner sensor area 16b and the outer sensor area 16a, and stored, or in the case of the alternate positions that have been moved vertically, measurements can be taken and stored from both the top and bottom of the sensor areas. Because at least some positions within each of the two sensor areas 16a and 16b are on the substrate 10, all of the sensor data collected is valid for the whole device patterns 14a and 14d.

In some embodiments this level measurement data is collected by setting the exposure energy in the second position 24 to zero, and then initiating an exposure sequence. In this manner the level measurement data is collected and stored, but the device patterns disposed adjacent the whole device patterns 14a and 14d, which are a part of a different field of view toward the interior of the substrate 10, are not double exposed.

Once the level measurement information is taken and stored as described above, the field of view 12 is realigned to the first position 20, and the field of view 12 is exposed in the first position 20. This is preferably accomplished without taking any level measurement readings at the first position 20. In a preferred embodiment, this is accomplished by turning off the active leveling setting of the aligner and initiating an exposure sequence. This causes the aligner to preferably use a nearest acceptable set of stored level measurement information, which is most preferably the level measurement information that was taken and stored in regard to the second position 24, as described above.

In a preferred embodiment of the invention, the aligner is programmed to align to and expose with zero energy all of the positions on the substrate 10 that are a second position 24, as the second position 24 is described above, which captures and stores the level measurement information for each such position. The aligner is then instructed to go to all of the positions on the substrate 10 that are a first position 20, as the first position 20 is described above, and the active leveling setting is turned off, and an exposure sequence is initiated, which causes the aligner to preferably use the level measurement information for the second position nearest the first position being exposed. After all of the first positions have been exposed, third positions representing the remaining unexposed positions within the interior of the substrate 10 are then aligned and exposed.

Figure 3:
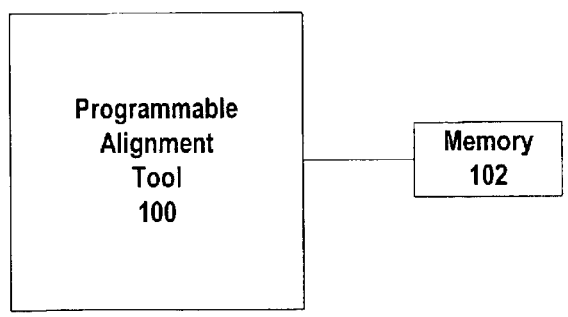
FIG. 3 depicts a functional representation of a programmable alignment tool.

FIG. 3 depicts a functional representation of a programmable aligner 100 according to the present invention, with a memory 102 that contains program instructions for enabling the aligner 100 to operate according to the steps described above. The memory 102 is preferably a digital memory, such as RAM, ROM, or a magnetically programmable digital medium, such as a floppy disk, or an optically programmable digital medium, such as a CD or DVD.

ASML EXAMPLE

The invention is a new way of defining images in order to obtain improved leveling information in order to better control the focus when exposing edge fields. A significant issue in leveling edge fields on lithography tool such as those produced by ASML Holding N.V., a corporation of Veldhoven, the Netherlands, is that due to the nature of printing several individual dies within a single exposure field, some level sensor spots may be in the exclusion zone (that region at the periphery of the wafer deemed unreliable either for printing or for leveling) or even off the wafer, even though some dies within that exposure field are entirely within the usable portion of the die ("good dies"). See FIG. 1.

This invention addresses this problem by introducing a dummy image for each problematic edge field. The dummy image is shifted horizontally toward the center of the wafer by a distance which places the outer level sensor spots on the outer edge of the good die(s). See FIG. 2. If a particular edge field is positioned such that pre-scan considerations prevent the dummy image from actively collecting leveling information, the dummy image may also be shifted vertically by a distance sufficient to allow all level sensor spots to turn on and collect leveling information. In order not to double-expose portions of the wafer, the exposure energy for the shifted dummy images is set to zero. This means that when they "expose," the dummy images do not actually expose the photoresist on the wafer, but merely collect leveling data as the scans are performed.

This method of defining dummy images allows for the collection of accurate leveling information for the good dies within edge fields, since the outer level sensor spots now correspond to the outer edges of these good dies. Having established a means for collecting accurate leveling information for the dies of interest, it remains to ensure that this particular information is actually the information which is used.

To do this, the main image for all edge fields in question must first be set to do no active leveling at all. This may seem counter-intuitive, but it is possible for an edge field to start an exposure scan actively leveling, but then scan down to a point along the curve of the wafer edge where a level sensor spot drops out. The tool will then rely on the first portion of the scan for feed-forward leveling information, but this may not necessarily by the optimal information for the dies we are seeking to improve. By preventing the main images for the edge fields from actively leveling, the feed-forward data from the optimized dummy images is used. This may be accomplished on ASML tools by selecting the "Static Local Level" option for all leveling modes (Z (focus height), Rx (tilt about the x-axis), and Ry (tilt about the y-axis)) for the main image in all edge fields in question. This mode specifies that the exposure scan in question should rely upon leveling data from a suitable prior exposure scan rather than actively leveling.

The next step is to ensure that the dummy images are considered suitable as a source of feed-forward data for the main images in the edge fields. ASML-type tools typically will not permit leveling information from one image to be used in exposing a different image (although information for a common image can be shared among multiple exposure fields). However, on ASML tools the "Share Level Information" option will permit leveling information from one image to be used in exposing a different image. Therefore, this option should be enabled.

The final step is to guarantee that the dummy images are not merely suitable sources for feed-forward leveling data, but are in fact the sources which are used for feed-forward leveling data for the main images in the edge fields. Once it is specified that an image needs to use feed-forward leveling data from a previous exposure, an ASML tool will search for any suitable previous exposure close to the current one. It is therefore preferable to specify that the dummy images are the only images which have been "exposed" prior to exposing the main images of the edge fields. Otherwise, if the main images on the interior of the wafer were also exposed prior to the edge fields, the tool might select an adjacent interior field as a suitable source of feed-forward data. However, the interior field would not have its level sensor positions optimally positioned as do the dummy images, so it would not provide optimal leveling data to the edge field. On ASML tools the "Double Exposure" option allows the user to specify the order in which all images are exposed. Without this option, ASML tools generally reverse the order of the images from one wafer to the next (the motivation being to minimize the amount of time spent repositioning a reticle to a new image).

On a lithography tool with a limited number of leveling spots, this method introduces dummy images which do not actually expose the wafer, but which are positioned to collect leveling data which is optimized for the edge fields on the wafer. It further guarantees that the edge fields do not use active leveling which might introduce leveling data which is non-optimal for the good dies within these fields. It allows the dummy images to be considered as valid sources for feed-forward leveling information for the main images of the edge fields. And it specifies that the tool expose first the dummy images, then the edge field main images, and only finally the fields in the interior of the wafer, thereby forcing the dummy images to be chosen as the source of feed-forward leveling data. It thereby provides optimal leveling information for the exposure of the edge fields on a wafer.

Note that some variability exists in exactly how the lithography tool interprets feed-forward leveling information. In order to truly optimize edge leveling, it might be advantageous to define the main image for an edge field as smaller than the actual full-field size; by defining the size to be only as large as the sum of the good dies for that field, it may be possible to translate the feed-forward data into leveling performance tailored to fit the good dies. Alternately, it might be preferable to define the main images of the edge fields at their full-field size, but also define these images as both shifted on the wafer (by a distance such that the outer edge of the image as defined lines up with the outer edge of the outermost actual good die for that field) and simultaneously shifted on the reticle (by a distance sufficient to counteract the shift on the wafer defined for the image). These virtual shifts might allow the tool to correctly apply feed-forward information for only the usable portion of the edge fields, while still maintaining a consistent stepping distance for the reticle.

The above outlines a particular method for collecting optimized leveling information and applying it to edge fields. However, other means may be employed to achieve the same end. For example, rather than defining distinct dummy images, and relying on the "Share Level Info" option to use their leveling data when exposing the edge field main images, it is possible to define a cell size within the scanner job which is considerably smaller than the actual full-field size (say, for example, a cell size of 1/10 the full-field size). For the main images, only 1 out of every 10 of the reduced cells would be defined as having a main image exposed (although the main image is still full-field size, so full wafer coverage is still obtained).

Rather than introducing dummy images, we can now introduce dummy fields of the main image. These are placed in the cells which most closely correspond to the optimal positions of the outer level sensor spots, just as the dummy images were positioned. These dummy fields can be set to zero exposure energy on an ASML tool via the "Exposure Offset" adjustment. And, since the dummy fields utilize the same main image as the edge fields, they are automatically valid sources of feed-forward leveling information for the edge fields. No matter what particular implementation is chosen, the key steps are the same: define scans which do not expose the wafer, but which collect leveling data which is optimal for the good dies within particular edge fields. Then make arrangements for this leveling data to actually be used when exposing the edge fields.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for leveling an exposure field of view at a peripheral edge of a substrate, the method comprising the steps of:

aligning the field of view to a first position at the peripheral edge of the substrate, where the field of view has an inner edge and an outer edge, relative to the peripheral edge of the substrate, identifying whole device patterns within the field of view, altering the alignment of the field of view to a second position so as to place the outer edge of the field of view adjacent the whole device patterns within the field of view, acquiring level measurement information from the field of view at the second position, storing the level measurement information, realigning the field of view to the first position, and leveling the substrate within the field of view at the first position using the level measurement information acquired from the field of view at the second position.

2. The method of claim 1, wherein the level measurement information acquired from the field of view at the second position is obtained from at least one sensor disposed in the outer edge of the field of view.

3. The method of claim 1, wherein the level measurement information acquired from the field of view at the second position is obtained from at least one sensor disposed in each of the outer edge of the field of view and the inner edge of the field of view.

4. The method of claim 1, wherein the step of acquiring level measurement information from the field of view at the second position comprises setting an exposure energy at the second position to zero and initiating an exposure sequence.

5. The method of claim 1, wherein the step of leveling the substrate within the field of view at the first position using the level measurement information acquired from the field of view at the second position comprises disabling active leveling at the first position and initiating an exposure sequence.

6. The method of claim 1, wherein the step of altering the alignment of the field of view to a second position comprises shifting the field of view vertically.

7. The method of claim 1, wherein the step of altering the alignment of the field of view to a second position comprises shifting the field of view horizontally.

8. In a programmable substrate exposure tool, the improvement comprising a memory containing program steps operable to instruct the programmable substrate exposure tool to perform the method of claim 1.

9. A digital storage medium containing program steps operable to instruct a programmable substrate exposure tool to perform the method of claim 1.

10. A method for exposing a substrate having a peripheral edge, the method comprising the steps of:

exposing second positions on the substrate at a zero energy by, aligning a field of view to a first position at the peripheral edge of the substrate, where the field of view has an inner edge and an outer edge, relative to the peripheral edge of the substrate, identifying whole device patterns within the field of view, altering the alignment of the field of view to a nearest of the second positions so as to place the outer edge of the field of view adjacent the whole device patterns within the field of view, acquiring level measurement information from the field of view at the nearest second position, and storing the level measurement information, exposing each first position on the substrate by, realigning the field of view to the first position, leveling the substrate within the field of view at the first position using the level measurement information acquired from the field of view at the nearest second position, and exposing the field of view at the first position, and exposing third positions located interior to the first positions and second positions on the substrate.

11. The method of claim 10, wherein the level measurement information acquired from the field of view at the nearest second position is obtained from at least one sensor disposed in the outer edge of the field of view.

12. The method of claim 10, wherein the level measurement information acquired from the field of view at the nearest second position is obtained from at least one sensor disposed in each of the outer edge of the field of view and the inner edge of the field of view.

13. The method of claim 10, wherein the step of leveling the substrate within the field of view at the first position using the level measurement information acquired from the field of view at the nearest second position comprises disabling active leveling at the first position and initiating an exposure sequence.

14. The method of claim 10, wherein the step of altering the alignment of the field of view to the nearest second position comprises shifting the field of view vertically.

15. The method of claim 10, wherein the step of altering the alignment of the field of view to the nearest second position comprises shifting the field of view horizontally.

16. In a programmable substrate exposure tool, the improvement comprising a memory containing program steps operable to instruct the programmable substrate exposure tool to perform the method of claim 10.

17. A digital storage medium containing program steps operable to instruct a programmable substrate exposure tool to perform the method of claim 10.

18. A method for exposing an exposure field of view at a peripheral edge of a substrate, the method comprising the steps of:

aligning the field of view to a first position at the peripheral edge of the substrate, where the field of view has an inner edge and an outer edge, relative to the peripheral edge of the substrate, identifying whole device patterns within the field of view, altering the alignment of the field of view to a second position so as to place the outer edge of the field of view adjacent the whole device patterns within the field of view, acquiring level measurement information from the field of view at the second position, storing the level measurement information, realigning the field of view to the first position, leveling the substrate within the field of view at the first position using the level measurement information acquired from the field of view at the second position, and exposing the field of view at the first position.

19. The method of claim 18, wherein the step of acquiring level measurement information from the field of view at the second position comprises setting an exposure energy at the second position to zero and initiating an exposure sequence.

20. The method of claim 18, wherein the step of leveling the substrate within the field of view at the first position using the level measurement information acquired from the field of view at the second position comprises disabling active leveling at the first position.

* * * * *